(12) United States Patent
Li (10) Patent No.: US 8,450,601 B2
(45) Date of Patent: May 28, 2013

(54) INTEGRATED PHOTOVOLTAIC MODULAR PANEL

(75) Inventor: Yi Li, Shenzhen (CN)

(73) Assignee: Shenzhen TRONY Science & Technology Development Co., Ltd., Shenzhen (CN)

( * ) Notice: Subject to any disclaimer, the term of this patent is extended or adjusted under 35 U.S.C. 154(b) by 255 days.

(21) Appl. No.: 12/837,118

(22) Filed: Jul. 15, 2010

(65) Prior Publication Data

US 2010/0282294 A1 Nov. 11, 2010

Related U.S. Application Data

(62) Division of application No. 11/419,498, filed on May 23, 2006, now Pat. No. 8,013,237.

(30) Foreign Application Priority Data

May 25, 2005 (CN) .......................... 2005 1 0034904

(51) Int. Cl.
*H01L 31/0224* (2006.01)
(52) U.S. Cl.
USPC .......................................... 136/256; 136/244
(58) Field of Classification Search
USPC .................. 136/243–245, 251, 252, 256, 259
See application file for complete search history.

(56) References Cited

U.S. PATENT DOCUMENTS 4,137,098 A * 1/1979 Field .............................. 136/248

FOREIGN PATENT DOCUMENTS

| DE | 3111969 A1 | 3/1981 |
|---|---|---|
| DE | 4140682 A1 | 12/1991 |
| DE | 19502949 A1 | 1/1995 |
| DE | 19503195 A1 | 2/1995 |
| DE | 19919215 A1 | 11/1999 |
| DE | 10109643 A1 | 2/2001 |
| EP | 0798787 A2 | 3/1997 |
| EP | 0993051 A2 | 8/1999 |
| JP | 56-15084 | 2/1981 |
| JP | 56-017081 | 2/1981 |
| JP | 58-77069 | 5/1983 |
| JP | 08-186280 | 7/1996 |
| JP | 08186280 A | 7/1996 |
| JP | 09-135039 | 5/1997 |
| JP | 10-331369 | 12/1998 |
| JP | 10331369 A | 12/1998 |
| JP | 11022127 A | 1/1999 |

* cited by examiner

*Primary Examiner* — Jonathan Johnson
*Assistant Examiner* — Christina Chern
(74) *Attorney, Agent, or Firm* — Anova Law Group, PLLC (57) ABSTRACT

An integrated photovoltaic modular panel for a curtain wall glass is used for the field of building integrated photovoltaic. The invention provides the standardized photovoltaic units, so that the electrodes in a photovoltaic panel main body can be internally parallel connected. The connector may be a metal piece of stamping or casting, which has a plug 1 and a socket 2 on both ends, a waist b in the middle, an inward concave straight strip 4 on both sides of the waist, an electrode plug-in socket 3 in the waist for firmly clamping solar cell, a plastic injection molding crust 5 for fixing and securing the connector, forming a module. It can combine with different kinds of glass, forming different kinds of photovoltaic curtain wall glass. The solar cell here may be an amorphous silicon solar cell.

11 Claims, 8 Drawing Sheets

INTEGRATED PHOTOVOLTAIC MODULAR PANEL

This application is a divisional patent application of U.S. patent application Ser. No. 11/419,498 filed on May 21, 2006, which U.S. Patent Application claims priority of Chinese Patent Application No. 200510034904.7 filed on May 25, 2005. This divisional patent application incorporates herein by reference the entire Chinese Patent Application No. 200510034904.7 filed on May 25, 2005.

BACKGROUND OF THE INVENTION

1. Field of the Invention

The present invention relates to an integrated photovoltaic modular panel for a curtain wall glass, and in particular, to a photovoltaic panel with amorphous silicon thin film solar cells, concerning with the field of building integrated photovoltaic.

2. Description of the Related Art

Currently, solar cells are connected together by conductive wires and formed a panel with hollow glass or laminated glass. Positive electrodes or negative electrodes on every solar cell of photovoltaic panel are connected in series or parallel. The internal wires are soldered together with an external lead. So the more solar cells to be parallel connected the lower mounting-efficiency is. Regardless of types of electricity supply systems, e.g., a stand-alone system or a networked system, the core of a PV system is a photovoltaic panel made of solar cells. A thin film solar cell does not use the silicon wafer. Instead, it uses a nanometer semiconductor active layer deposited on an inexpensive substrate, such as glass. Thus, the cost of material is greatly reduced. In addition, it has advantage in the manufacturing under lower temperature and can produce a larger size of thin film solar cells.

At present, the photovoltaic panels made from crystal or amorphous silicon solar cells can be used as curtain walls in building material. The peak power of an amorphous silicon solar cell can reach more than 60 Wp. With larger area and better rigidity, the amorphous silicon solar cell, is suitable for making large and extra-large size photovoltaic panels used as photovoltaic curtain wall glass. The photovoltaic panels used as curtain walls in buildings meet the second security standard requirements for its good rigidity and high insulation. In accordance with the industrial standard requirements for battery material, the photovoltaic panel can last for more than 10 years even in a tough environment, such as plus 90 degree or minus 50 degree in Celsius.

A metal frame for supporting solar cells is disclosed in the Chinese invention (application number 200410028002.8), where the solar cells are amorphous silicon solar cells which can accommodate large size, good rigidity and few electrode connection. In addition, the solar cells are easy to form a panel which is arranged at intervals for light transmitting and suits for architecture aesthetics. But one issue has been brought as more photovoltaic panels are used in curtain wall glass. That is, the assembly process can became very complicated and time consuming for the large number of electrodes. The inner structure of the curtain wall glass may be changed and it requires a large space for transporting. In addition, the maintenance is quite difficult, for example, the whole frame needs to be dismantled in order to replace a broken solar cell.

SUMMARY OF THE INVENTION

The present invention provides an integrated photovoltaic modular panel for a curtain wall glass, whose internal electrodes are connected by the means of joining photovoltaic units through plugging the connectors together just like playing building blocks.

One object of the present invention is to provide a standardized connector on the photovoltaic panel such that the connector is an independent device and can quickly connect with various electrodes in different ways.

Another object of the present invention is to provide a photovoltaic unit that consists of solar cell strips and connectors. The solar cell strips are made from thin film solar cells, especially from large size of amorphous silicon thin film solar cells. The main body of an integrated photovoltaic modular panel is created by parallel connecting the internal electrodes of several photovoltaic units together. It is then assembled together with hollow glass or laminated glass to form a building integrated photovoltaic system.

An integrated photovoltaic modular panel for a curtain wall glass according to this invention comprises a photovoltaic panel main body where internal electrodes are connected. The two electrodes heads of a solar cell are respectively inserted into a connector, forming a photovoltaic unit. And pluralities of photovoltaic units are plugged together through said connectors, forming the photovoltaic panel main body.

The internal electrodes of the photovoltaic units are composed of the positive electrode and the negative electrode of at least one solar cell. The connector is a metal piece of stamping or casting, which has a plug and a socket on both ends, an electrode plug-in socket at the waist. The plug is a long spindle and the socket on the bottom is a slot with biconcave section being flexible, by which the plug is convenient to plug into or unplug from said socket, having excellent electrical contact for tight fit. The connector may have a plane symmetry structure.

The connector has a slantwise or upright electrode plug-in socket at the waist of the connector, and the electrode plug-in socket is in excellent electrical contact with inserted electrode for firmly fastening. The connector may have an insulated crust around it and a plurality of fixed-size holes are set on the surface of the insulated crust. The surface of the solar cells of the photovoltaic units can be pasted with a transparent sheet.

An integrated photovoltaic modular panel comprises cells, glass and other accessories, and a photovoltaic panel main body, which has a plurality of photovoltaic units with their positive electrode or negative electrode being parallel connected. The two electrode heads of a thin film solar cell strip are respectively inserted into connector, forming a photovoltaic unit. The surface of the solar cells in the photovoltaic units can be pasted with a transparent sheet to agglutinate and seal with exterior glass/PET. An integrated photovoltaic modular panel has at least one photovoltaic unit. And the photovoltaic unit has at least one solar cell strip with its two electrode heads respectively connected with a connector. The connector itself has a predetermined width and length, with a plug and a socket on both ends, a slantwise or upright electrode plug-in socket at the waist. The solar cell strip can slantwise or upright insert into the connector. The connector, a metal piece of stamping or casting, is an integrated electric piece with plug, socket and waist. The section of the plug looks like spindle. The socket is a slot with its section looks like X-shaped form. There is an insulated crust around the connector, formed as a plastic injection molding module, with fixed-size holes on the crust or on the proper place of up and down surface. The plug of the connector protrudes from the up surface of the crust. The socket and the electrode plug-in socket of the connector are concealed in the module.

The invention standardizes the photovoltaic units and modularizes the photovoltaic panels. With a standard plug, the photovoltaic units can be integrated together in various ways. The photovoltaic panel main body is easily be modified according to the field applications. The assembly process of a photovoltaic panel main body by using prepared photovoltaic units becomes very easy and quick. And the photovoltaic panel main body is suitable for mass production. Even at the construction site, the photovoltaic panel main body can be easily combined with different kinds of glass, forming different kinds of photovoltaic curtain wall glass.

The solar cells in an integrated photovoltaic modular panel here are thin film solar cells. The low cost solar cells employ nanometer semiconductor active layer deposited on an inexpensive substrate using the low temperature technology, such as glass, instead of silicon wafer. So the integrated photovoltaic panel here is competitive and has potential in market.

BRIEF DESCRIPTION OF THE DRAWINGS

In the drawings:

FIG. 2-1 is a front elevation of FIG. 2;

FIG. 2-2 is a cross section view of A-A plane in FIG. 2;

FIG. 2-3 is a schematic view of the connecting effect of FIG. 2;

FIG. 4-1 is a schematic view of the connecting effect of FIG. 4;

DETAILED DESCRIPTION OF THE PREFERRED EMBODIMENT

Figure 1:
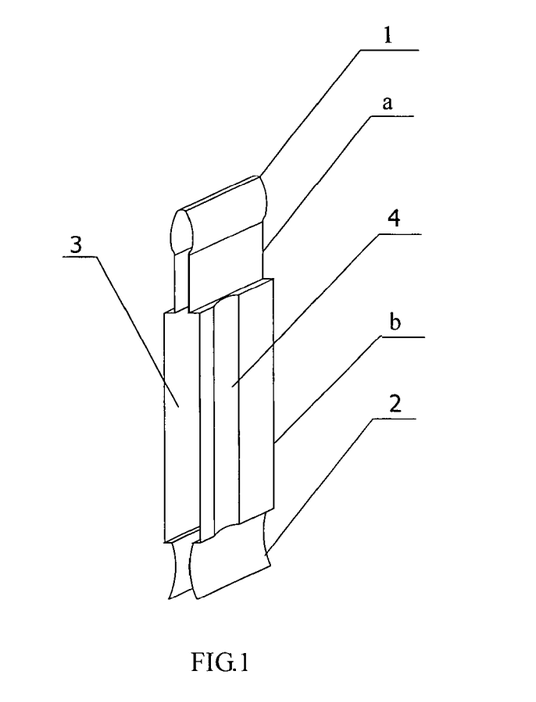
FIG. 1 is a schematic view of a metal connector in according with the invention.
Figure 5:
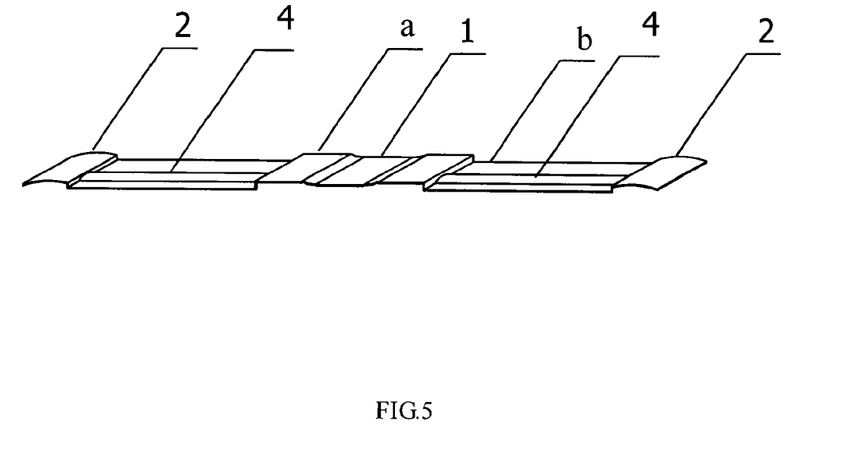
FIG. 5 is a schematic view of FIG. 1. outspreaded evenly.

Referring first to FIG. 1 and FIG. 5 a connector has a plug 1 and socket 2 on both ends, a neck a and a waist b in the middle. As shown, the plug 1 is an outer convex, looks like spindle. The neck a is a plane. The socket 2 on the bottom is outer biconcave and inner convex, forming a slot. It forms a tight fit when the plug 1 a of first connector inserts into the socket 2 of a second connector. There is an upright electrode plug-in socket 3 in the neck a and waist b of the connector. A straight strip 4 locates on each of the two sides of the waist b. The straight strip 4 is inner convex and outer concave, so it can firmly fasten an inserted solar cell electrode like an elastic clamp, with excellent electrical contact with the electrodes of the inserted solar cell. Generally, the connector is a copper piece with some thickness. The length of the waist b, here being the same length with the electrode plug-in socket, is approximately equivalent with the width of the inserted solar cell.

Figure 2:
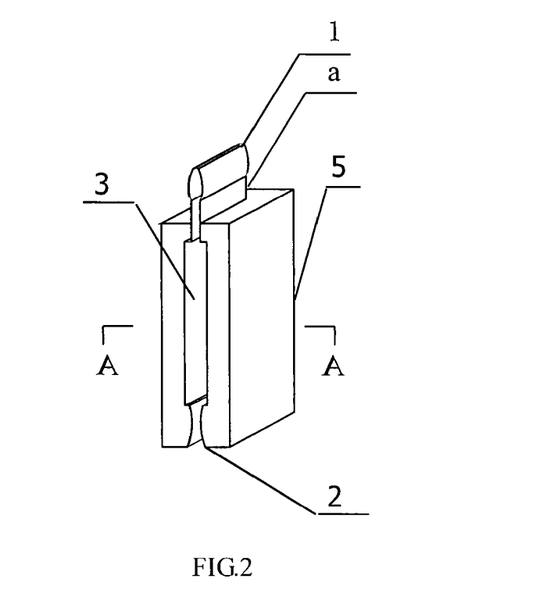
FIG. 2 is a schematic view of a plastic injection molding crust around the metal connector in FIG. 1.

FIG. 5 is a schematic view of FIG. 1 outspreaded evenly. As shown, the connector may be a metal piece of stamping. When the metal piece outspreaded evenly is folded double back, the connector is formed. The connector also may be a metal piece of casting. The upright electrode plug-in socket 3 in fact is a cleft between two metal sides of the waist b. The inner of the straight strip 4 is convex, which is in excellent electrical contact with inserted electrode for firmly fastening it like a clamp. As shown in FIG. 2, there is a plastic injection molding crust 5 around the connector in FIG. 1. The plastic injection molding crust 5 may be a hexagon prism insulating and enclosing the connector, forming a connector module. The plug 1 and the neck a protrude from the connector module. The socket 2 and the upright electrode plug-in socket 3 are concealed in the module. So the plastic injection molding crust 5 enable electrodes of photovoltaic units to electrically contact well each other through the connectors in the molding crusts. The plastic injection molding crust 5, which itself is a standard piece and fits for architecture aesthetics, has an effect of insulating, fixing and securing of a photovoltaic unit with two electrodes inserted in the connector. The signs in FIG. 2-1, FIG. 2-2 and FIG. 2-3 have the same meaning as mentioned above.

Figure 3:
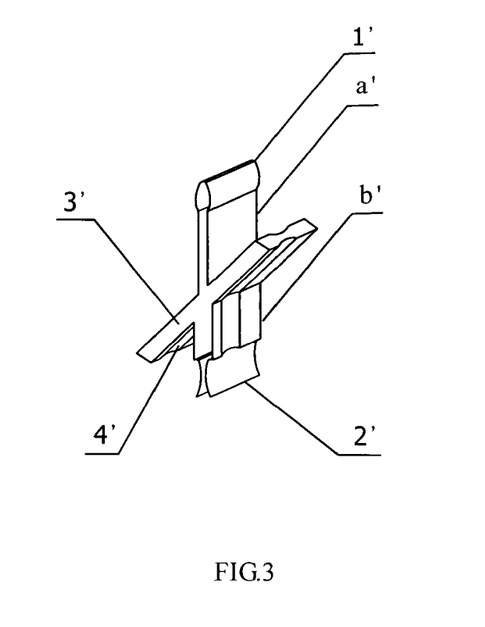
FIG. 3 is a schematic view of a connector with a slantwise electrode plug-in socket in according with the invention.
Figure 6:
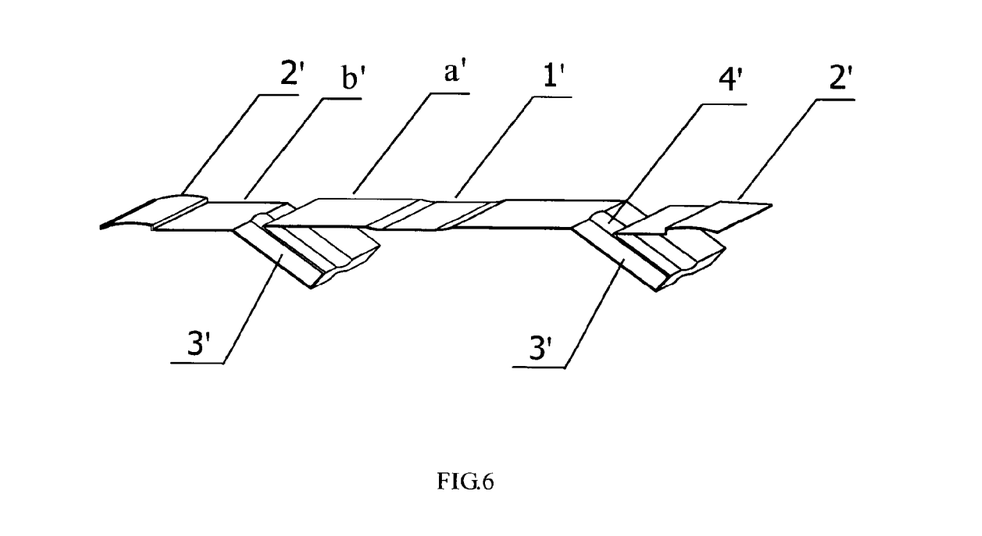
FIG. 6 is a schematic view of FIG. 3. outspreaded evenly.

Referring to FIG. 3 and FIG. 6, another embodiment of connector is shown, which has a slantwise electrode plug-in socket 3'. It is similar to the preferred embodiment in FIG. 1 but a prescribed angle exists between the surface of the slantwise electrode plug-in socket 3' and the surface of the neck a' or the waist b'. The plug 1' is outer convex, looks like spindle. Located under the neck a', the socket 2' is outer concave and inner convex at two sides, forming a slot. There is an excellent electrical contact when the plug 1' of a first connector was inserted into socket 2' of a second connector for tight fit. There is a straight strip 4' on each of the two sides of the slantwise electrode sockets 3', which is inner convex and outer concave. So the straight strip 4' can firmly fasten the electrodes of an inserted solar cell like an elastic clamp, and is in excellent electrical contact with the electrodes of the inserted solar cell.

Figure 4:
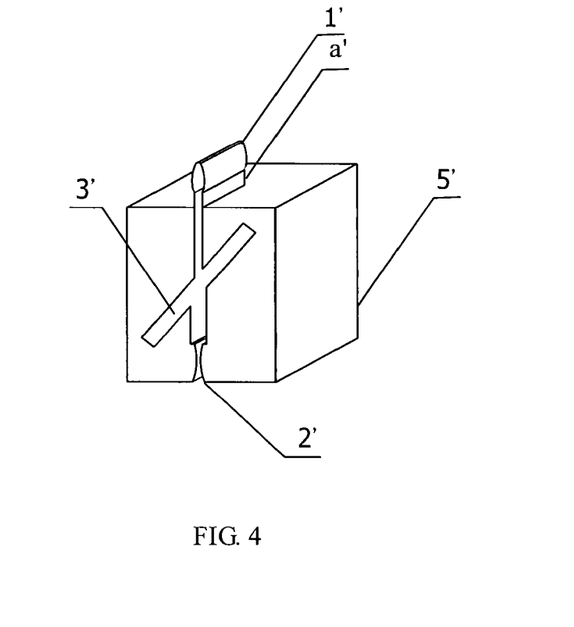
FIG. 4 is a schematic view of a plastic injection molding crust around the connector with a slantwise electrode plug-in socket in FIG. 3.

Referring to FIGS. 4 and 4-1, a plastic injection molding crust 5' around the connector in FIG. 3 is shown. The plastic injection molding crust 5' is also a standard piece, usually being a hexagonal prism (FIG. 4 shows a rectangular prism). The plug 1' and the neck a' are exposed from the plastic injection molding crust 5'. The socket 2' and the upright electrode plug-in socket 3' are concealed in the plastic injection molding crust 5'. The plastic injection molding crust 5' have the same function as the crust 5 mentioned in FIG. 2, for example, insulating, fixing and securing of the connector.

Figure 7:
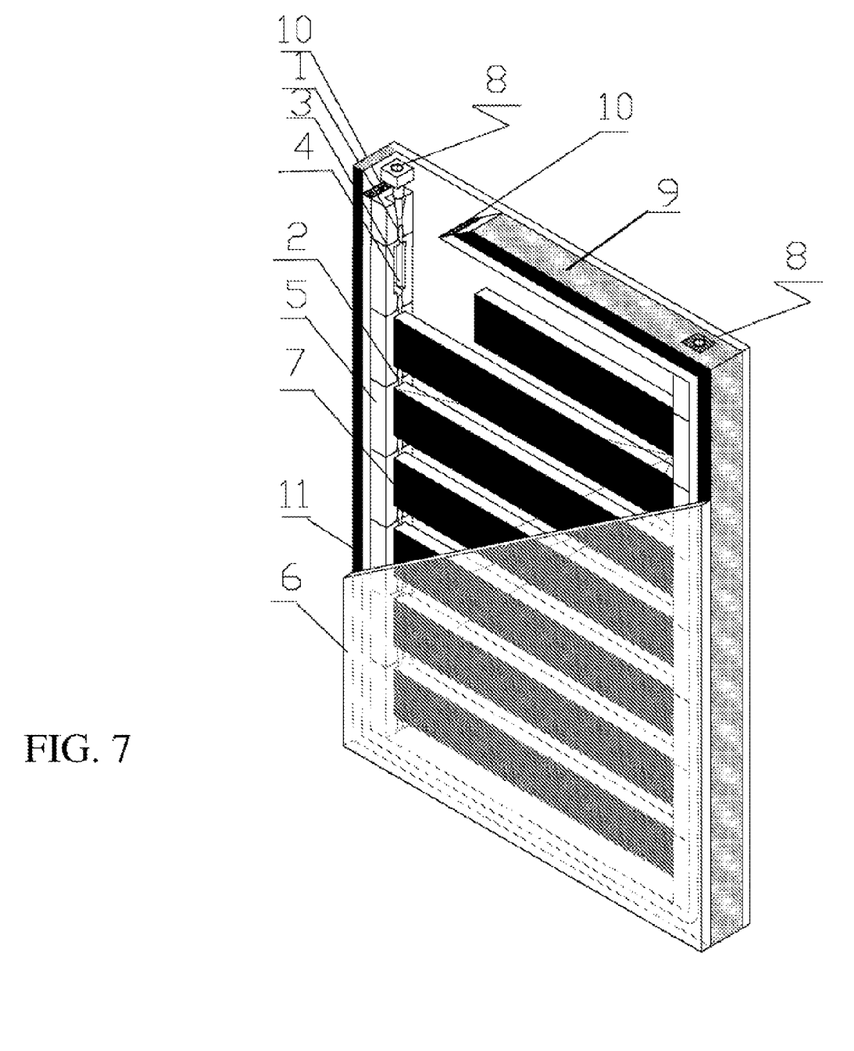
FIG. 7 is a hollow photovoltaic curtain wall glass according the first embodiment of the invention.

Referring to FIG. 7, a photovoltaic panel according to this invention combines with hollow glass. The thin film solar cell 7 is made into a strip, each end having or acting as an electrode. A standard photovoltaic unit is formed by connecting each end of the thin film solar cell strip 7 with a connector. The connector is a standard piece after stamping processing of a metal piece and with a plastic injection molding crust 5 around it. The connector has a plug 1 and a socket 2 on both ends, a neck a, an electrode plug-in socket 3 (e.g., shown in FIG. 1). The straight strip 4 locates on each sides of the waist b. The straight strip 4 is inner convex and outer concave, so it can firmly hold the inserted electrode of the solar cell strip 7 like an elastic clamp. The photovoltaic units in the photovoltaic panel main body are arranged at intervals for light transmitting, i.e., the solar cell strips of the photovoltaic units are arranged at an internal such that light can transmitted through the interval and/or the solar cell strips. The photovoltaic panel main body is installed in the vertical aluminum frame 9 mounted on the edge of the hollow glass 6. The exterior electrodes 8 are an element with an exterior positive electrode and an exterior negative electrode. The molecule mesh 10, a molecule mesh layer between the photovoltaic panel main body and the aluminum frame 9, and the seal glue 11 placed between the surface of the photovoltaic panel main body and hollow glass 6 are also indicated in FIG. 7.

The size and the amount of the output power of a photovoltaic curtain wall glass according to this invention can be adjusted according to practical needs. The solar cells here may be thin film solar cells, in accordance with the prescription of battery material industry. Amorphous silicon solar cell is the best choice due to its abundant resource and low cost. The solar cells are cut into strips with prescribed width and length according to actual design, which may be 12V, 24V, 48V or others, with electrodes on both ends of the strip. A solar cell strip connects with connectors on both ends, forming a photovoltaic module. Here the photovoltaic module is a photovoltaic unit. And a photovoltaic panel main body can compose multiple photovoltaic units. In actual applications, the photovoltaic unit is standardized in various sizes according to the dimension of the inner frame of a curtain wall glass.

Furthermore, the standard photovoltaic units can be easily installed in the inner frame of the curtain wall glass, without changing the structure of the inner frame and without grooving on the aluminum frame for installing cells. The connectors, themselves being conductive, form internal electrode connection through plugging together, with a positive electrode bar and a negative electrode bar respectively on each side of the photovoltaic panel main body (as shown as two connector bars connecting to exterior electrodes 8). The crust around the connector, which is parallel placed, acts as an insulator between the photovoltaic panel main body and the inner frame of a curtain wall glass. In summary, the connector is a key element in the invention. First, it forms internal electrodes, i.e., a positive electrode bar and a negative electrode bar respectively on each side of the photovoltaic panel main body. Second, the connector and its crust form the frame of the photovoltaic panel main body and provide function of insulation, stability and protection.

The photovoltaic curtain wall glass according to this invention has extensive use. For example, it can be used as curtain wall, window, roof, greenhouse shed, swimming pool and so on.

For illustrative purposes, several embodiments of the invention are further described as below:

The first embodiment is a photovoltaic hollow curtain wall glass. A photovoltaic unit is formed when the solar cell strip's two ends, i.e., a positive electrode and a negative electrode, are respectively connected with a connector with a slantwise electrode plug-in socket 3' as shown in FIG. 3 and FIG. 4. Multiple photovoltaic units, equipped with crust 5' around the connector, composes a photovoltaic panel main body through inserting the plug 1' into the socket 2' just like stacking building blocks. The internal electrodes of the photovoltaic panel main body are formed as a positive electrode bar and a negative electrode bar respectively such that the photovoltaic units are parallel connected. The left frame and the right frame of the photovoltaic panel main body are formed by stacking together multiple crusts 5'. The photovoltaic units in the photovoltaic panel main body are arranged with intervals for light transmitting. The photovoltaic panel main body can be directly installed in the inner frame of a hollow curtain wall glass. The solar cells in the photovoltaic panel main body look like louvered slats in a Venetian blind for it is slantwise to the vertical plane of the curtain wall glass. That is, the angle of the slantwise socket is designed similar to the angle of the Venetian blind of photovoltaic strips.

In this embodiment, the connector with a slantwise electrode plug-in socket 3' as shown in FIG. 3 and FIG. 4 can be substituted by that with an upright electrode plug-in socket 3 as shown in FIG. 1 and FIG. 2. A photovoltaic unit is formed when the solar cell strip's two ends, a positive electrode and a negative electrode, are respectively connected with the upright electrode plug-in sockets 3 of two connectors. The photovoltaic panel main body comprising multiple photovoltaic units can also be installed in the inner frame of a hollow curtain wall glass. The solar cells in the photovoltaic panel main body, paralleling with the curtain wall glass and having intervals for light transmitting, look like louvered slats too.

Figure 8:
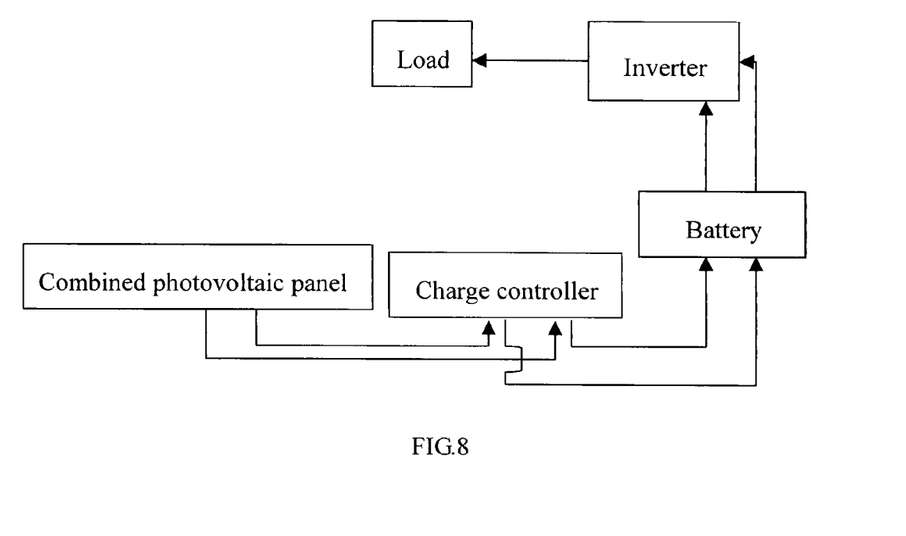
FIG. 8 is a stand-alone electricity supply system according the second embodiment of the invention.
Figure 21:
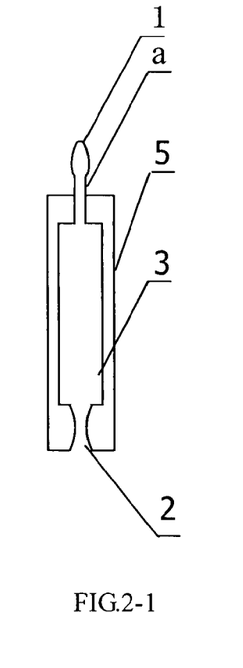
Figure 22:
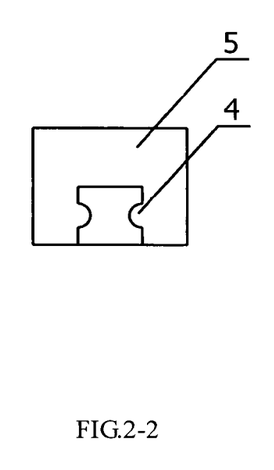
Figure 23:
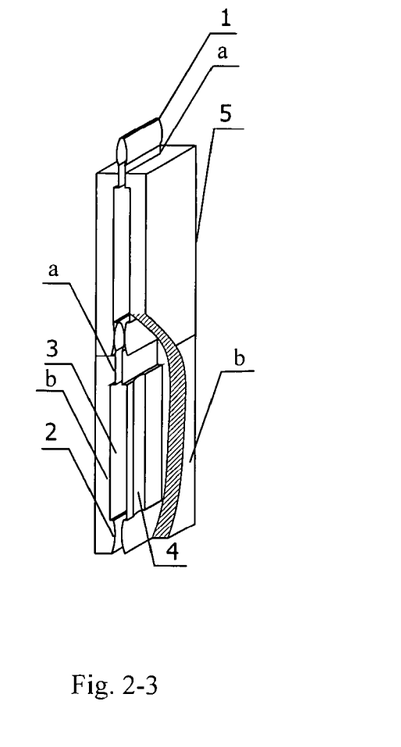
Figure 41:
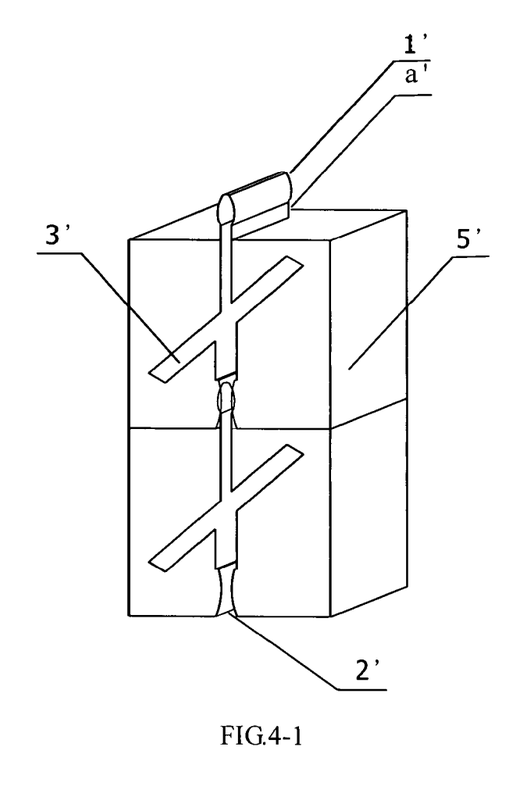

The second embodiment is a stand-alone electricity supply system. Photovoltaic arrays comprising multiple integrated photovoltaic panels as mentioned above are parts of a stand-alone electricity supply system or a grid-connected electricity generation network. Referring to FIG. 8, A stand-alone electricity supply system generally has an integrated photovoltaic panel 35, a charge controller 40, an inverter 25 and a battery 30. When the value of the voltage of the output power produced by the integrated photovoltaic panel 35 reaches a predetermined level, through the charger controller 40 the electrical power can be stored in a battery 30 of 12 v, 24 v or 48 v. And then the inverter 25 converts direct current with low voltage to alternating current with 110 v or 220 v, providing a load 20 with steady and secure electrical power.

The third embodiment is a photovoltaic panel main body integrated with low-emissivity coated glass (low-E glass) or low-iron toughened texture glass (white glass). The photovoltaic panel main body as mentioned above is installed between two layers of low-E glass or white glass. The internal electrodes are fixed and insulated with the inner frame of the glass by coating glue on the surface of the frame. To ensure satisfactory sealing, seal glue is placed between the surface of the photovoltaic panel main body and exterior glass. The internal electrodes are connected with the exterior electrodes. And the exterior electrodes are exposed to the air. So the frame of the photovoltaic panel main body is concealed in the glass.

The fourth embodiment is a photovoltaic curtain wall glass without the need for additional floor space. The photovoltaic unit in the photovoltaic curtain wall glass can be made into a standard piece. During installation, the photovoltaic units is plugging together just like stacking building blocks. The crust around connector may have fixed holes on the proper places of top and bottom surface of crust so as to strengthen the frame of the internal electrodes.

The fifth embodiment is a photovoltaic panel main body integrated with decorated glass. The solar cells in the photovoltaic panel main body may be amorphous silicon solar cells of low light. The back glass of the solar cells may be decorated with artistic figures. So the photovoltaic panel main body not only supplies electrical power but also possesses of aesthetic feeling.

In summary, the integrated photovoltaic curtain wall glass according to the invention not only has the advantage of converting solar energy into electrical power, but also has other advantages, such as transparent, heat insulating, sound insulating, reducing light pollution and so on. In recent years, societal consciousness of health and environment protection has been increasing all over the world. Public attention has been focused on clean energy, especially on solar energy because it's evenly accessible at any place in the world. In average, each square meter on the earth can receive annually 1000 kWh solar energy. And the establishment of energy requirements will greatly promote the development and use of solar energy. The era of mass using photovoltaic curtain wall glass is coming.

What is claimed is:

1. An integrated photovoltaic modular panel for a curtain wall glass containing wall glasses and exterior electrodes, the integrated photovoltaic modular panel comprising:

a photovoltaic panel main body comprising a plurality of photovoltaic units having a plurality of thin-film solar cells and a plurality of connectors, wherein the plurality of thin-film solar cells are respectively inserted into the plurality of connectors to form the plurality of photovoltaic units, wherein each thin-film solar cell comprises two opposing ends, wherein each of the ends are inserted into respective connectors, and the plurality of photovoltaic units are plugged together through the plurality of connectors to form said photovoltaic panel main body where the plurality of connectors are connected to form internal electrodes coupling the plurality of thin-film solar cells in parallel;

wherein each said connector has a slantwise electrode plug-in socket at a waist, which is in electrical contact with and firmly fastens the inserted thin-film solar cell, wherein said connector includes a plug on an upper end and a socket on a bottom end, and said plug has a shape of a long spindle and said socket on the bottom end has a shape of a slot having an elastic biconcave section, which provides a tightly fitted electrical contact between the plurality of connectors, wherein said plug is easily plugged into and unplugged from said socket on the bottom end of another connector.

2. The integrated photovoltaic modular panel according to claim 1, wherein the thin-film solar cell comprises a positive electrode on one end and a negative electrode on the other end.

3. The integrated photovoltaic modular panel according to claim 1, wherein said connector is a stamped or cast metal.

4. The integrated photovoltaic modular panel according to claim 2, wherein said connector is a stamped or cast metal, and the positive and negative electrodes on the thin-film solar cell are respectively inserted into the slantwise electrode plug-in socket at the waist of a first stamped or cast metal and the slantwise electrode plug-in socket at the waist of a second stamped or cast metal.

5. The integrated photovoltaic modular panel according to claim 4, wherein said connector has a plane symmetry structure.

6. The integrated photovoltaic modular panel according to claim 1, wherein a transparent sheet is formed on a surface of each of said solar cells.

7. An integrated photovoltaic modular panel, comprising:
curtain wall glasses; and
a photovoltaic panel main body, having a plurality of photovoltaic units containing a plurality of thin-film solar cells and a plurality of connectors, wherein each thin-film solar cell has a positive electrode on one end and a negative electrode on the other end, and both ends of the thin-film solar cell are inserted to corresponding connectors to form one photovoltaic unit, and the plurality of photovoltaic units are plugged together through the plurality of connectors to form said photovoltaic panel main body, wherein the plurality of connectors are connected to form internal electrodes coupling the plurality of thin-film solar cells in parallel, and wherein each said connector is a stamped or cast metal which is surrounded by an insulator to form a connector module, wherein each said connector has a slantwise electrode plug-in socket at a waist, which is in electrical contact with and firmly fastens the inserted thin-film solar cell, wherein said connector includes a plug on an upper end and a socket on a bottom end, and said plug has a shape of a long spindle and said socket on the bottom end has a shape of a slot having an elastic biconcave section, which provides a tightly fitted electrical contact between the plurality of connectors, wherein said plug is easily plugged into and unplugged from said socket on the bottom end of another connector.

8. The integrated photovoltaic modular panel of claim 7, wherein each said connector has a predetermined width and length.

9. The integrated photovoltaic modular panel of claim 8, wherein said connector is a single piece integrated with the plug, the socket and the waist, and the slantwise electrode plug-in socket is a slot with a X-shaped section.

10. The integrated photovoltaic modular panel of claim 9, wherein the plug of each said connector protrudes from said connector module, the socket and the electrode plug-in socket of said connector are enclosed in said connector module.

11. The integrated photovoltaic modular panel of claim 7, wherein a transparent sheet is formed on a surface of each of said solar cells.

* * * * *